US008614567B2

(12) United States Patent  (10) Patent No.: US 8,614,567 B2
Wu  (45) Date of Patent: Dec. 24, 2013

(54) VOLTAGE REGULATOR STRUCTURES AND METHODS WITH BOOTSTRAPPED BIAS CAPACITOR

(75) Inventor: Guoming Wu, Shanghai (CN)

(73) Assignee: Analog Devices, Inc., Norwood, MA (US)

(*) Notice: Subject to any disclaimer, the term of this patent is extended or adjusted under 35 U.S.C. 154(b) by 415 days.

(21) Appl. No.: 12/985,178

(22) Filed: Jan. 5, 2011

(65) Prior Publication Data

US 2012/0169306 A1  Jul. 5, 2012

(51) Int. Cl.
*G05F 1/565* (2006.01)
(52) U.S. Cl.
USPC .............................. 323/271; 323/282; 323/285
(58) Field of Classification Search
USPC ............................ 323/271, 282, 284, 285, 288
See application file for complete search history.

(56) References Cited

U.S. PATENT DOCUMENTS

| 5,627,460 | A | * | 5/1997 | Bazinet et al. | 323/288 |
|---|---|---|---|---|---|
| 5,742,151 | A | | 4/1998 | Hwang | 323/222 |
| 5,798,635 | A | | 8/1998 | Hwang et al. | 323/222 |
| 6,281,730 | B1 | * | 8/2001 | Vu | 327/170 |
| 6,348,779 | B1 | | 2/2002 | Sluijs | 323/222 |
| 6,972,548 | B2 | | 12/2005 | Tzeng et al. | 323/282 |
| 7,026,801 | B2 | * | 4/2006 | Fowler et al. | 323/271 |
| 7,045,992 | B1 | | 5/2006 | Silva et al. | 323/222 |
| 7,109,688 | B1 | | 9/2006 | Chin et al. | 323/222 |
| 7,161,333 | B2 | * | 1/2007 | Soch | 323/224 |
| 7,230,408 | B1 | | 6/2007 | Vinn et al. | 323/273 |
| 7,248,027 | B2 | | 7/2007 | Ribeiro et al. | 323/282 |
| 7,321,258 | B2 | * | 1/2008 | Wong et al. | 327/589 |
| 7,358,711 | B2 | | 4/2008 | Sutardja et al. | 323/283 |
| 7,382,114 | B2 | | 6/2008 | Groom | 323/271 |
| 7,468,622 | B2 | * | 12/2008 | Bodano et al. | 327/390 |
| 2008/0203991 | A1 | * | 8/2008 | Williams | 323/288 |
| 2008/0218141 | A1 | * | 9/2008 | Lu et al. | 323/282 |
| 2011/0148368 | A1 | * | 6/2011 | Burns et al. | 323/225 |
| 2012/0091976 | A1 | * | 4/2012 | Chen et al. | 323/271 |
| 2012/0242393 | A1 | * | 9/2012 | Chen et al. | 327/390 |

OTHER PUBLICATIONS

Chen, Jingdong, "Determine Buck Converter Efficiency in PFM Mode", Power Electronics Technology, Sep. 2007, pp. 28-33.
"Optimizing Low Voltage Buck DC/DC Converter Efficiency", AN-107 Application Note, Analogic Technologies, Sunnyvale, California, 6 pages, 2005.
"An Efficiency Primer for Switch-Mode, DC-DC Converter Power Supplies", Application Note 4266, Dec. 2008, 13 pages, Maxim Integrated Products, Sunnyvale, California.

* cited by examiner

*Primary Examiner* — Adolf Berhane
*Assistant Examiner* — Fred E Finch, III
(74) *Attorney, Agent, or Firm* — Schwegman Lundberg & Woessner, P.A.

(57) ABSTRACT

Voltage regulator structures and methods embodiments are provided which employ a high-side N-type switching transistor to thereby enhance system efficiency and also reduce the die area required by these regulator structures. This structure and its advantages, however, require a gate drive signal higher than the input voltage of the voltage regulator. The embodiments resolve this need with a bias capacitor in a bootstrapped arrangement and a control loop arranged to maintain a bias voltage across the capacitor sufficient to always insure rapid switching of the high-side switching transistor during a pulse-width modulation (PWM) operational mode. The embodiments further include a second control loop arranged to insure sufficient voltage across the capacitor during a pulse-frequency modulation (PFM) operational mode.

20 Claims, 2 Drawing Sheets

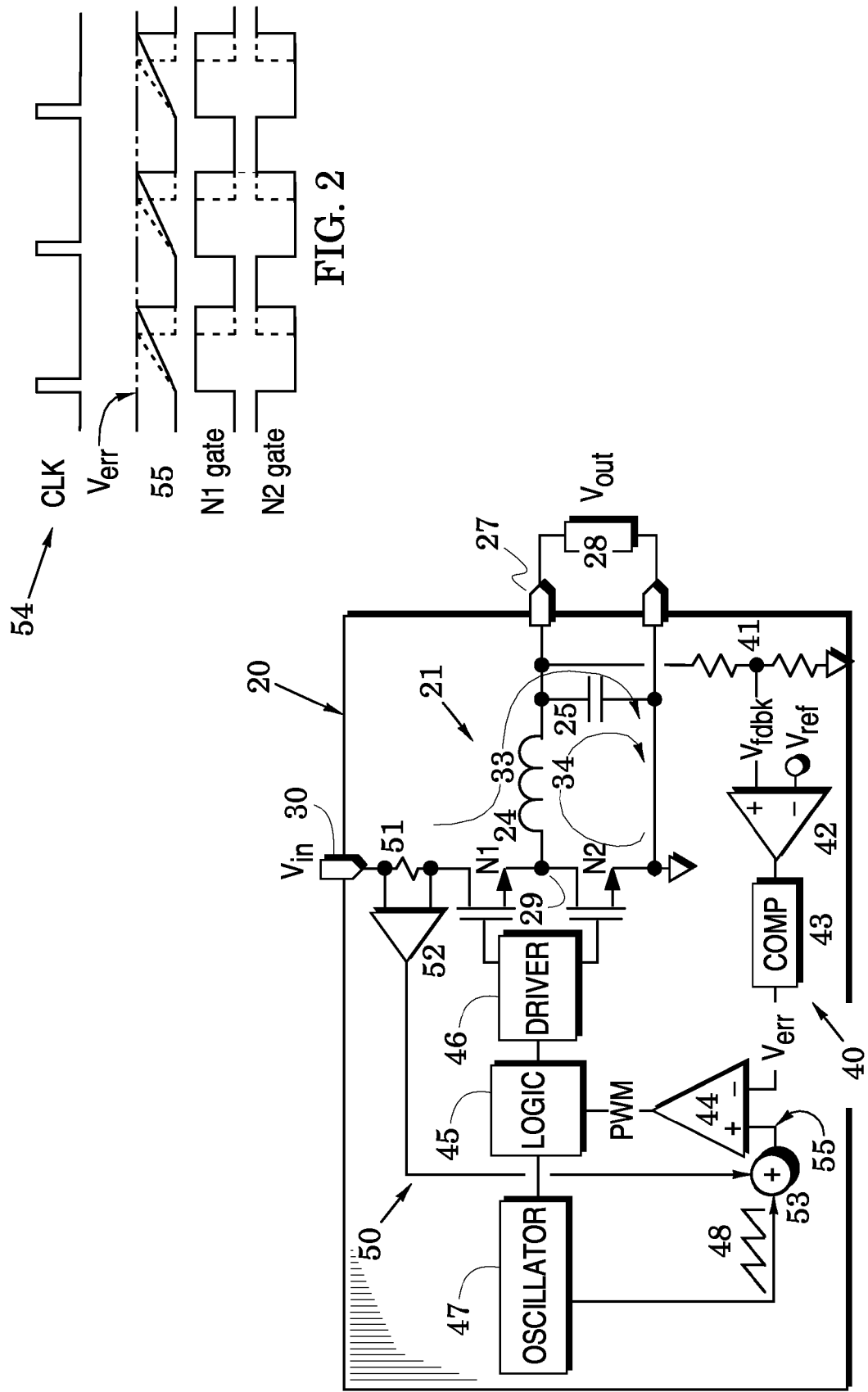

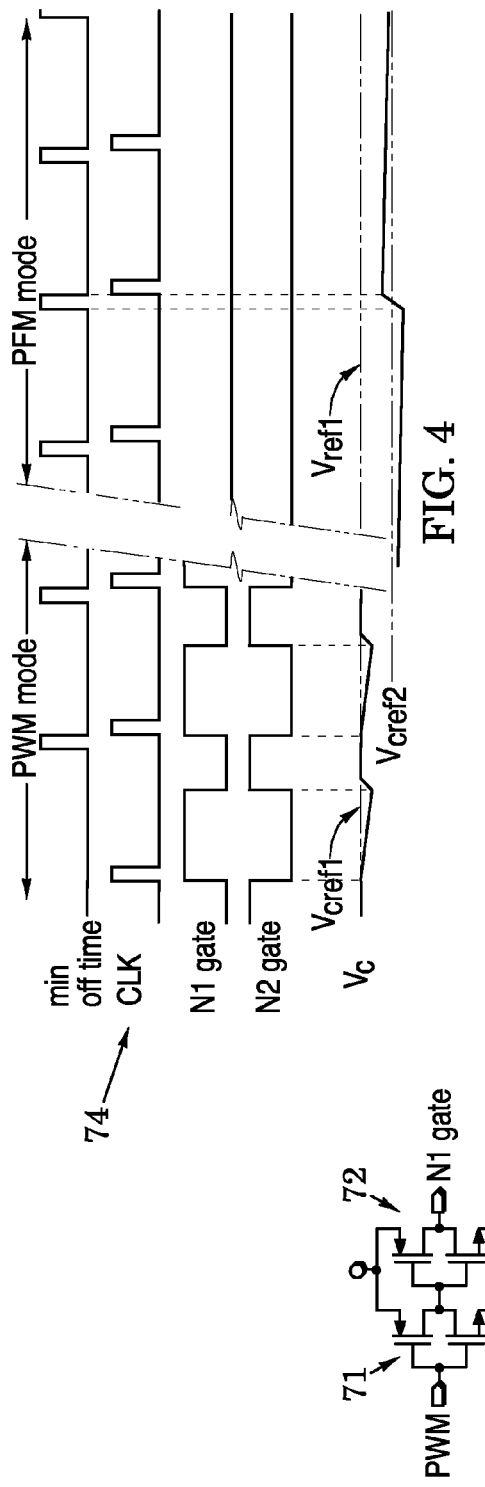
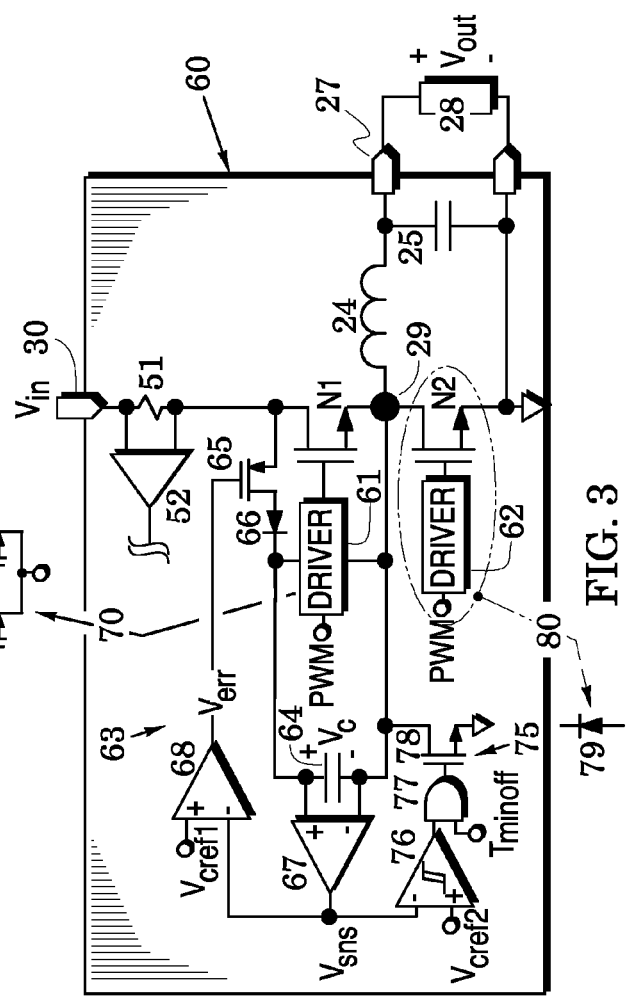
FIG. 3
FIG. 4

US 8,614,567 B2

VOLTAGE REGULATOR STRUCTURES AND METHODS WITH BOOTSTRAPPED BIAS CAPACITOR

BACKGROUND OF THE INVENTION

1. Field of the Invention

The present description relates generally to switching voltage regulators.

2. Description of the Related Art

Switched-mode voltage regulators provide superior voltage conversion efficiency because they regulate an output voltage with transistor switches that are either on or off so that they never operate in the linear region in which both current and voltage are nonzero. Because at least one of transistor current and voltage is therefore always close to zero, dissipation is greatly reduced so that the regulator efficiency is quite high.

These regulators often operate in two different operational modes. When current demand is medium to high, they preferably operate in a pulse-width modulation mode in which transistor currents are switched on and off during each clock period. When current demand is low, they preferably operate in a pulse-frequency modulation operational mode in which transistor currents are briefly switched on when an output voltage drops below a predetermined threshold. The latter mode enhances operational efficiency during low current demand because it reduces switching losses in the transistor switches. In the pulse-width modulation mode, the switching duty cycle corresponds to the current drain whereas in pulse-frequency modulation mode, the switching frequency corresponds to the current drain.

BRIEF SUMMARY OF THE INVENTION

The present embodiments are generally directed to voltage regulator systems that enable enhanced efficiency and reduced die area. The drawings and the following description provide an enabling disclosure and the appended claims particularly point out and distinctly claim disclosed subject matter and equivalents thereof.

BRIEF DESCRIPTION OF THE DRAWINGS

FIG. 1 is a schematic of a switching voltage regulator system embodiment;

FIG. 2 is a graph that illustrates signals in the arrangement of FIG. 1;

FIG. 3 is a schematic of an embodiment of a capacitor-based biasing arrangement in the system of FIG. 1; and FIG. 4 is a graph that illustrates signals in the arrangement of FIG. 3.

DETAILED DESCRIPTION OF THE INVENTION

FIGS. 1-4 illustrate voltage regulator structures and methods that employ a high-side N-type switching transistor to thereby enhance system efficiency and also reduce the die area required by these regulator structures. This structure and its advantages, however, require a gate drive signal higher than the input voltage $V_{in}$ of the voltage regulator. The embodiments illustrated in FIGS. 1-4 resolve this need with a bias capacitor in a bootstrapped arrangement and a control loop arranged to maintain a bias voltage across the capacitor sufficient to always insure rapid switching of the high-side switching transistor during a pulse-width modulation (PWM) operational mode. The embodiments further include a second control loop to insure sufficient voltage across the capacitor during a pulse-frequency modulation (PFM) operational mode.

In particular, the voltage regulator system embodiment 20 of FIG. 1 includes a switching voltage regulator 21 that is formed with first and second transistors N1 and N2, an inductor 24, and an output capacitor 25. The capacitor is coupled across an output port 27 to supply an output voltage $V_{out}$ to an output load 28. The inductor is coupled between the capacitor and a circuit switching node 29. The low-side second transistor N2 is coupled between the switching node and ground and the high-side first transistor N1 is coupled between the switching node and an input voltage port 30.

During a first portion of each of successive clock periods, the high-side first transistor N1 is turned on to thereby raise the switching node 29 almost to an input voltage $V_{in}$ at the input voltage port 30. This initial action drives a current 33 through the inductor 24 and capacitor 25 (a portion of this current may be diverted through the load 28). During a final second portion of each of the successive clock periods, the low-side second transistor N2 is turned on to thereby pull the switching node 29 almost to a circuit ground. This final action allows the inductor to continue to support a gradually-declining second current 34 through the capacitor and load. These first and second actions through successive clock periods maintain the output voltage $V_{out}$ in a process that is highly efficient because, in each clock period, each of the first and second transistors is off in one period portion and has only a small saturation voltage across it when carrying current in the other period portion.

The duration of the first portion of each clock period is adjusted to establish a duty cycle for the first transistor that is automatically controlled to maintain the output voltage $V_{out}$ at a predetermined level. The adjustment is accomplished with a voltage feedback loop 40 that is preferably supplemented by a current feedback loop 50. The voltage feedback loop includes a resistive divider 41, a differential amplifier 42, loop compensation 43, comparator 44, logic 45, and driver 46. An oscillator 47 provides a clock signal to the logic 45 and a sawtooth voltage waveform 48 to the differential amplifier 44.

In operation, the resistive divider provides a feedback voltage $V_{fdbk}$ which the differential amplifier 42 compares to a reference voltage $V_{ref}$ and provides in response, an error voltage $V_{err}$ that is frequency shaped by the frequency response of the compensation 43. In response to the sawtooth voltage waveform 48 and the error voltage $V_{err}$, the comparator 44 provides a pulse-width modulation (PWM) signal to the logic 45. In response to each period of the clock from the oscillator 47 and to the PWM signal from the comparator 44, the logic 45 commands the driver 46 to turn on the first transistor N1 to realize a duty cycle in this transistor that is determined by the feedback loop 40. The driver then turns on the second transistor N2 for the remainder of each clock period. Accordingly, the first and second transistors respectively pass the first and second currents 33 and 34 in the respective first and second portions of each clock period to maintain the feedback voltage $V_{fdbk}$ substantially equal to the reference voltage $V_{ref}$. This process will maintain the output voltage $V_{out}$ at the output port 27 at the desired level regardless of the current demand of the load 28.

Although the voltage feedback loop 40 maintains a desired voltage across the output load 28, it responds relatively slowly to variations in the input voltage $V_{in}$ at the input port 30. The current feedback loop 50 resolves this problem with a resistor 51, a differential amplifier 52, and a summer 53. Input current from the input port 30 generates a corresponding voltage across the resistor 51 which produces a voltage level at the output of the differential amplifier 52. This voltage level is summed with the sawtooth voltage waveform 48 in the summer 53 to produce a ramp signal 55 that is provided to the comparator 44.

The graph 54 of FIG. 2 illustrates the clock signal from the oscillator 47, the signals at the gates of the first and second transistors N1 and N2, and the ramp signal 55. The solid lines for the ramp signal correspond to a first amplitude of the input current across the resistor 51 of FIG. 1. As shown in FIG. 2, when the ramp signal 55 crosses the level of the error voltage $V_{err}$ out of the loop compensation 43, the voltage level at the N1 gate falls and the voltage level at the N2 gate rises. This condition corresponds to a first duty cycle for the first transistor N1.

The broken lines in FIG. 2 for the ramp signal 55 correspond to an increased second amplitude of the input current across the resistor 51. Because the ramp signal 55 now crosses the level of the error voltage $V_{err}$ earlier, the voltage level at the N1 gate falls sooner and the voltage level at the N2 gate rises sooner. This condition corresponds to a second duty cycle for the first transistor N1 that is less than the first duty cycle.

The lesser second duty cycle automatically offsets the increased input current across the resistor 51 to maintain the desired output voltage Vout across the load 28. Although the voltage feedback loop 40 would have eventually made this correction on its own, its response is slower than that of the current feedback loop 50. It has been found that the combination of the two control loops 40 and 50 enhances the performance of the voltage regulator system 20.

In the embodiment of FIG. 1, the first transistor N1 is preferably chosen to be an N-type metal-oxide-semiconductor field-effect (MOSFET) transistor to thereby enhance efficiency and also facilitate a small die size that reduces the die area needed for the voltage regulator system 60.

FIG. 3 illustrates a voltage regulator system 60 that includes elements of the system 20 of FIG. 1 with like elements indicated by like reference numbers. Although the system 60 includes the voltage feedback loop 40 and current feedback loop 50 of the system 20 of FIG. 1, they are not shown in FIG. 3 (other than the resistor 51 and the amplifier 52) to make room for additional structure. This structure includes transistor drivers 61 and 62 and a bootstrap capacitor 64 that is coupled across the driver 61. The transistor drivers 61 and 62 respectively drive the first and second transistors N1 and N2 in response to the PWM signal of FIG. 1 which is conditioned through the logic 45 for application to the drivers.

An embodiment arrow 70 directs attention to an embodiment of the driver 61 that is formed with an input complementary common-drain transistor stage 71 that responds to the PWM signal. This stage drive an output complementary common-drain transistor stage 72 which supplies the gate signal to drive the first transistor N1. Each of these stages inverts its input signal so that the combination does not invert the PWM signal.

With reference to the embodiment 70, it is important to note that the voltage at the bottom port of the capacitor 64 is the same as the voltage at the switching node 29 (which is enlarged in FIG. 3 to call attention to it) and that the voltage at the upper port of the capacitor 64 will substantially be the voltage on the gate of the first transistor N1. When the PWM signal is high, the N1 gate signal at the output of the driver 61 is approximately the voltage at the top port of the capacitor 64 which is nearly the input voltage $V_{in}$. When the PWM signal is low, the N1 gate signal is approximately the voltage at the bottom port of the capacitor 64 which is the voltage at the switching node 29.

The voltage on the capacitor 64 thus forms the gate-to-source voltage $V_{gs}$ of the first transistor and this voltage should be set sufficiently high to effectively and rapidly drive the first transistor into saturation. On the other hand, this voltage should be controlled to not be so high as to damage the first transistor. In an example in which the input voltage $V_{in}$ is 10 volts and the controlled output voltage $V_{out}$ is 8 volts, it may be desirable to have the voltage across the capacitor 64 set to and maintained at approximately 5 volts.

Some current must be supplied to keep the first transistor in saturation each time it is biased on. This current is required, for example, to charge parasitic capacitance on the gate of the first transistor N1. In order to counter this current drain and maintain the voltage across the capacitor 64 for effective operation of the voltage regulator system 60, the capacitor must therefore be rapidly charged back to 5 volts during the time in each clock period in which transistor N1 is off and transistor N2 is on.

To achieve these goals, the system 60 includes a negative feedback control loop 63 that includes a third transistor 65 coupled to the drain of the first transistor N1 and a diode 66 that couples the third transistor 65 to the upper port of the driver 61. The loop also includes a differential sense amplifier 67 coupled about the capacitor 64 to provide a sense voltage $V_{sns}$ representative of the voltage across this capacitor and further includes an differential error amplifier 68 that provides an error voltage $V_{err}$ in response to the difference between the sense voltage $V_{sns}$ and a first capacitor reference voltage $V_{crefl}$. In the example above in which it is desired that the capacitor voltage (and thus the sense voltage $V_{sns}$) be controlled to be 5 volts, the reference voltage $V_{crefl}$ should be set to this same value.

The left-hand side of the graph 74 of FIG. 4 illustrates signals in the regulator system 60 of FIG. 3 during its PWM mode of operation. As shown, the gate of the first transistor N1 is high for an initial portion of each period of a clock signal (labeled CLK) and the gate of the second transistor N2 is high for the remaining second portion of each period. It is assumed that the feedback loops 40 and 50 of FIG. 1 have established these portions (i.e., this duty cycle of the first transistor) in order to maintain the feedback voltage $V_{fdbk}$ substantially equal to the reference voltage $V_{ref}$ in FIG. 1.

During the first period portion, the switching node 29 of FIG. 3 is pulled almost up to the input voltage $V_{in}$ which was assumed earlier to be 10 volts. The voltage $V_c$ across the capacitor 64 is assumed to be initially equal to the capacitor reference voltage $V_{crefl}$ that was set to 5 volts. Accordingly, the voltage at the top of the capacitor 64 is approximately 15 volts so that the diode 66 is biased off and the control loop 63 is inoperative. The diode also protects the transistor 65 from damage. At this time the first transistor N1 is driven into saturation. As shown in FIG. 4, the capacitor voltage $V_c$ across the capacitor 64 declines during the first portion of each clock period because of current required to maintain the first transistor in saturation.

During the second portion of the clock period, the second transistor N2 is on and this pulls the switching node 29 nearly to ground. The voltage at the top of the capacitor 64 is now slightly less than 5 volts so that the diode 66 is biased on and the feedback control loop 63 is activated. Because the sense voltage $V_{sns}$ of the differential sense amplifier 67 is now below the reference voltage $V_{crefl}$, the differential error amplifier 68 provides an error voltage V, that controls the third transistor 65 to insert a current through the diode 66 and into the capacitor 64 to controllably and rapidly bring the voltage $V_c$ back up to substantially the first capacitor reference voltage $V_{cref1}$ as shown in the graph 74 of FIG. 4.

The feedback loop 63 rapidly recharges the capacitor. This recharge time has been found to be less than 70 nanoseonds so that the voltage regulator system 69 can operate, for example, with a clock speed of 1.4 MHz and a duty cycle as large as 90%. It is also noted that at this time the capacitor 64 further acts as a compensation capacitor to insure stability of the feedback loop 63.

The voltage regulation process described above is generally known as pulse-width modulation because the width of the pulse of the first transistor N1 relative to the clock period (i.e., N1's duty cycle) is modulated as needed to maintain the desired output voltage $V_{out}$ at the output port 27. PWM is highly suited for heavy and medium loads but becomes inefficient for light loads that demand little or no current.

Under these light-load conditions, switching losses in the first and second transistors become dominant so that efficiency is enhanced by converting to a skip mode in which operation of the first and second transistors N1 and N2 during each clock period ceases. Instead, the first transistor N1 is only turned on briefly when the feedback voltage falls below a second voltage reference generally set somewhat lower than the reference $V_{ref}$ provided to the differential amplifier 42 in FIG. 1.

In these light-load conditions, the first transistor N1 is briefly turned on only when the output voltage $V_{out}$ drifts below the second voltage reference. That is, the frequency of the first transistor's pulse is modulated which is why this operational mode is often referred to as pulse-frequency modulation. It is also called a discontinuous mode in contrast to the continuous mode exemplified by PWM. In PFM, the switching node 29 in FIG. 3 no longer swings between the input voltage $V_{in}$ and ground in each clock period but, rather, remains substantially at the predetermined output voltage most of the time and occasionally pulses upward to the input voltage $V_{in}$ when the output voltage drifts below second voltage reference.

During the PFM mode, the capacitor voltage $V_c$ will slowly drift downward as the capacitor 64 supplies small, periodic currents to the first transistor N1 (e.g., to charge its parasitic gate capacitance). If the capacitor voltage $V_c$ drifts too low during PFM mode, e.g., below 3 volts, the first transistor N1 may not be controllable when the system load grows heavier and the system tries to return to the PWM mode. It is noted that if the output voltage is nominally 10 volts, the top of the capacitor is now 13 volts so that the diode 66 is biased off the feedback loop 63 is inactive.

To handle this performance requirement, the voltage regulator system 60 includes a second negative-feedback control loop 75 that comprises a comparator 76, an AND gate 77, and a fourth transistor 78 as shown in FIG. 3. The comparator compares the sense voltage to a second capacitor reference voltage $V_{cref2}$ and is coupled to drive the AND gate when the sense voltage drops below the level (e.g., 3 volts) of the second reference voltage $V_{ref2}$.

A second input $T_{minoff}$ to the AND gate is a min-off time pulse that occurs in the last portion of each clock period as shown in the graph 74 of FIG. 4. This pulse is chosen to be in the portion of each clock period that is never used by the N1 gate pulse when the first transistor N1 is operating at its highest duty cycle.

In response to the AND gate, the fourth transistor 74 pulls the switching node 29 down to ground. Because the voltage at the top of the capacitor 64 is now below the input voltage $V_{in}$, diode 66 turns on and the first control loop 63 (including the differential amplifiers 67 and 68, the third transistor 65 and the diode 66) is activated to quickly charge recharge the capacitor 64.

The comparator 70 is preferably a hysteresis comparator so that it turns on somewhat below the second reference voltage $V_{cref2}$ and turns off somewhat above this reference voltage as shown in the graph 74 of FIG. 4. Thus, the transistor 78 is turned on when the capacitor voltage Vc drifts sufficiently below the second capacitor reference voltage $V_{cref2}$ and when the min-off time pulse occurs. As soon as the capacitor voltage Vc rises sufficiently above the second reference voltage $V_{cref2}$ to turn off the comparator 76 (as shown in FIG. 4), the second control loop 75 is deactivated. Accordingly, the voltage of the switching node 29 rises and biases off the diode 66 and the control loop 63. During the PFM mode, this action repeats each time the capacitor voltage drifts below the second reference voltage $V_{cref2}$.

Prototype versions of the voltage regulator system 60 have been shown to met the operational descriptions above. They have exhibited, for example, a clock speed (switching frequency) of 1.4 MHz (714 nanosecond period), a maximum duty cycle of the first transistor N1 of 90% (minimum off-time of 71 nanoseconds), and an input voltage range of 3-20 volts.

The regulator systems above have been described with reference to a synchronous system in which a second transistor is driven during each clock period to pull the switching node 29 near ground. In another non-synchronous regulator system, the second transistor N2 and its associated driver 62 can be replaced by a diode 79 as shown by a replacement arrow 80 in FIG. 3.

The regulator embodiments described herein are exemplary and numerous modifications, variations and rearrangements can be readily envisioned to achieve substantially equivalent results, all of which are intended to be embraced within the spirit and scope of the appended claims.

I claim:

1. A voltage regulator system to provide an output voltage, comprising:
    a switching voltage regulator that includes first and second transistors coupled together at a switching node to generate said output voltage in both a pulse-width modulation (PWM) mode and a pulse-frequency modulation (PFM) mode;
    a capacitor having a first end coupled to said switching node;
    a transistor driver circuit coupled across said capacitor and arranged to drive said first transistor;
    a first negative feedback control loop arranged to charge said capacitor in response to a voltage drop of said switching node during the PWM mode; and
    a second negative feedback control loop to charge said capacitor during the PFM mode.

2. The system of claim 1, wherein said first negative feedback control loop includes:
    a third transistor to receive an input voltage;
    a diode arranged to couple said third transistor to a second end of said capacitor;
    a first differential amplifier coupled about said capacitor to provide a sense voltage indicative of voltage across said capacitor; and
    a second differential amplifier arranged to drive said third transistor in response to a difference between said sense voltage and a predetermined reference voltage.

3. The system of claim 2, wherein said driver circuit includes a complementary common-source stage arranged to drive said first transistor.

4. The system of claim 2, further including:
a comparator responsive to a difference between said sense voltage and a second reference voltage;
a fourth transistor coupled to said switching node; and
a gate to drive said fourth transistor in response to said comparator during a predetermined time period.

5. The system of claim 2, wherein said regulator further includes:
an output capacitor; and
an inductor coupled between said switching node and said output capacitor;
said output voltage thereby provided across said output capacitor.

6. The system of claim 5, further including a voltage feedback loop coupled to said output capacitor and configured to drive said first and second transistors to generate said output voltage.

7. The system of claim 6, further including a current feedback loop coupled to said first transistor and configured to provide an input current signal to said voltage feedback loop.

8. The system of claim 2, wherein said first and second transistors are metal-oxide-semiconductor field-effect transistors.

9. A method to provide an output voltage, comprising the steps of:
with a driver circuit biased by a capacitor coupled to a switching node, driving a transistor of a switching voltage regulator to inject current into said switching node during a first portion of each of consecutive clock periods to thereby generate said output voltage in both a pulse-width modulation (PWM) mode and a pulse-frequency modulation (PFM) mode; and
when said transistor is off during a second portion of each of said clock periods, charging said capacitor to a reference voltage with a first feedback control loop in the PWM mode and with a second feedback control loop in the PFM mode.

10. The method of claim 9, further comprising the step of pulling said switching node down approximately to ground during said second portion.

11. The method of claim 10, wherein said pulling step includes the step of driving a second transistor of said switching voltage regulator to pull current from said switching node.

12. The method of claim 9, further comprising the steps of:
turning off said transistor during a period of light current demand from said regulator;
when said output voltage drops below a second reference voltage, pulling said switching node down to ground; and
charging said capacitor above said second reference voltage.

13. A voltage regulator system to provide an output voltage, comprising:
a switching voltage regulator that includes first transistor and a first diode coupled together at a switching node to generate said output voltage in both a pulse-width modulation (PWM) mode and a pulse-frequency modulation (PFM) mode;
a capacitor having a first end coupled to said switching node;
a transistor driver circuit coupled across said capacitor and arranged to drive said first transistor;
a first negative feedback control loop arranged to charge said capacitor in response to voltage drop of said switching node during the PWM mode; and
a second negative feedback control loop to charge said capacitor during the PFM mode.

14. The system of claim 13, wherein said first negative feedback control loop includes:
a third transistor to receive an input voltage;
a diode arranged to couple said third transistor to a second end of said capacitor;
a first differential amplifier coupled about said capacitor to provide a sense voltage indicative of voltage across said capacitor; and
a second differential amplifier arranged to drive said third transistor in response to a difference between said sense voltage and a predetermined reference voltage.

15. The system of claim 14, wherein said driver circuit includes a complementary common-source stage arranged to drive said first transistor.

16. The system of claim 14, further including:
a comparator responsive to a difference between said sense voltage and a second reference voltage;
a fourth transistor coupled to said switching node; and
a gate to drive said fourth transistor in response to said comparator during a predetermined time period.

17. The system of claim 14, wherein said regulator further includes:
an output capacitor; and
an inductor coupled between said switching node and said output capacitor;
said output voltage thereby provided across said output capacitor.

18. The system of claim 17, further including a voltage feedback loop coupled to said output capacitor and configured to drive said first and second transistors to generate said output voltage.

19. The system of claim 18, further including a current feedback loop coupled to said first transistor and configured to provide an input current signal to said voltage feedback loop.

20. The system of claim 14, wherein said first transistor is a metal-oxide-semiconductor field-effect transistor.

* * * * *